US007689726B1

(12) United States Patent
Sundararajan et al.

(10) Patent No.: US 7,689,726 B1
(45) Date of Patent: Mar. 30, 2010

(54) BOOTABLE INTEGRATED CIRCUIT DEVICE FOR READBACK ENCODING OF CONFIGURATION DATA

(75) Inventors: Prasanna Sundararajan, Mountain View, CA (US); Brandon J. Blodget, Santa Clara, CA (US); Scott P. McMillan, Santa Clara, CA (US); Philip B. James-Roxby, Longmont, CO (US); Eric R. Keller, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 828 days.

(21) Appl. No.: 10/956,884

(22) Filed: Oct. 1, 2004

(51) Int. Cl.
*G06F 3/00* (2006.01)
*H03K 19/173* (2006.01)
(52) U.S. Cl. .............................. 710/8; 326/38; 326/39; 326/41; 713/1; 713/100
(58) Field of Classification Search ................. 710/8, 710/108, 15; 709/221, 238; 713/164, 1, 713/2, 100; 326/38, 39, 41
See application file for complete search history.

(56) References Cited

U.S. PATENT DOCUMENTS

| | | | | |
|---|---|---|---|---|
| 5,974,473 | A * | 10/1999 | Leavitt et al. ................... | 710/8 |
| 6,028,445 | A * | 2/2000 | Lawman ....................... | 326/38 |
| 6,049,222 | A * | 4/2000 | Lawman ....................... | 326/38 |
| 6,092,123 | A * | 7/2000 | Steffan et al. .................. | 710/8 |
| 6,172,520 | B1 * | 1/2001 | Lawman et al. ............... | 326/38 |
| 6,204,687 | B1 | 3/2001 | Schultz et al. | |
| 6,308,311 | B1 * | 10/2001 | Carmichael et al. ........... | 716/16 |
| 6,425,077 | B1 * | 7/2002 | Le et al. ......................... | 713/1 |
| 6,496,971 | B1 | 12/2002 | Lesea et al. | |
| 6,629,311 | B1 | 9/2003 | Turner et al. | |
| 6,738,962 | B1 | 5/2004 | Flaherty et al. | |
| 6,912,601 | B1 * | 6/2005 | Moore .......................... | 710/10 |
| 7,167,025 | B1 | 1/2007 | Schmit et al. | |
| 7,171,548 | B2 * | 1/2007 | Smith et al. ..................... | 713/1 |
| 7,242,218 | B2 * | 7/2007 | Camarota et al. .............. | 326/41 |
| 7,328,335 | B1 * | 2/2008 | Sundararajan et al. ......... | 713/1 |
| 7,444,546 | B2 * | 10/2008 | Kimelman et al. ............. | 714/31 |
| 2001/0037458 | A1 * | 11/2001 | Kean ........................... | 713/193 |

(Continued)

OTHER PUBLICATIONS

Altera's White Paper 'FPGA Design Security Solution Using MAX II Devices,' Ver. 1.0, Sep. 2004.*

(Continued)

*Primary Examiner*—Henry W. H. Tsai
*Assistant Examiner*—Steven G Snyder
(74) *Attorney, Agent, or Firm*—W. Eric Webostad

(57) ABSTRACT

Method and apparatus for encoding configuration data is described. An integrated circuit device having a configuration interface is coupled to boot memory coupled at the configuration interface. The boot memory contains boot cores for configuring the integrated circuit device via the configuration interface. The boot cores include a configuration encoder core and an internal processor interface core. The boot cores may further include a processor core. The configuration encoder core provides a peripheral interface internal to the integrated circuit device, and the boot memory contains at least one set of instructions for encoding configuration data read from configuration memory. The encoded configuration data may be sent via the peripheral interface. Alternatively, configuration encoder core may include a configuration bitstream for instantiating an encoder in configurable resources for encoding readback configuration data.

22 Claims, 11 Drawing Sheets

U.S. PATENT DOCUMENTS

| | | | |
|---|---|---|---|
| 2003/0018892 A1* | 1/2003 | Tello | 713/164 |
| 2003/0028690 A1* | 2/2003 | Appleby-Alis et al. | 710/8 |
| 2003/0033450 A1* | 2/2003 | Appleby-Alis | 710/8 |
| 2004/0049609 A1* | 3/2004 | Simonson et al. | 710/8 |
| 2004/0093488 A1* | 5/2004 | Horanzy | 713/1 |
| 2005/0235138 A1* | 10/2005 | Fujii et al. | 713/2 |

OTHER PUBLICATIONS

U.S. Appl. No. 10/377,857, filed Feb. 28, 2003, Blodget et al.
U.S. Appl. No. 10/917,033, filed Aug. 12, 2004, Patterson et al.
U.S. Appl. No. 10/956,989, filed Oct. 1, 2004, Sundarajan et al.

* cited by examiner

BOOTABLE INTEGRATED CIRCUIT DEVICE FOR READBACK ENCODING OF CONFIGURATION DATA

FIELD OF THE INVENTION

One or more aspects of the invention relate generally to readback of configuration data of a programmable logic device ("PLD") for encoding such configuration data.

SUMMARY OF THE INVENTION

An aspect of the invention is a method for sending encoded data from a programmable logic device, comprising: accessing at least one boot core with the programmable logic device, the at least one boot core for configuring the programmable logic device; configuring the programmable logic device responsive to the at least one boot core accessed that provides a peripheral interface internal to the programmable logic device; obtaining configuration data written to configuration memory of the programmable logic device via an internal interface of the programmable logic device; accessing at least one set of instructions by a processing device of the programmable logic device; encoding by the processing device the configuration data with the at least one set of instructions to provide encoded configuration data; and sending the encoded configuration data via the peripheral interface.

Another aspect of the invention is a method for sending encoded data from a programmable logic device, comprising: accessing at least one boot core with the programmable logic device, the at least one boot core for configuring the programmable logic device; configuring the programmable logic device responsive to the at least one boot core accessed that provides a peripheral interface and an encoder internal to the programmable logic device; obtaining configuration data written to configuration memory of the programmable logic device via an internal interface of the programmable logic device; encoding by the encoder the configuration data to provide encoded configuration data; and sending the encoded configuration data via the peripheral interface.

Another aspect of the invention is a system for decoding configuration data, comprising: a programmable logic device having an internal configuration access port, configuration memory, a configuration interface and configuration logic; boot memory coupled to the configuration interface of the programmable logic device; the boot memory containing boot cores for writing to the configuration memory via the configuration interface and the configuration logic to configure the programmable logic device; the boot cores including an encoder core; the encoder core for providing a peripheral interface and an encoder internal to the programmable logic device; the encoder for encoding configuration data obtained from the configuration memory via the internal configuration access port; and the peripheral interface for sending the configuration data encoded external to the programmable logic device.

Another aspect of the invention is a system for decoding configuration data, comprising: a programmable logic device having an internal configuration access port, configuration memory, a configuration interface and configuration logic; boot memory coupled to the configuration interface of the programmable logic device; the boot memory containing boot cores for writing to the configuration memory via the configuration interface and the configuration logic to configure the programmable logic device; the boot cores including an encoder core; the encoder core for providing a peripheral interface internal to the programmable logic device; at least one set of instructions accessible by a processing device of the programmable logic device, the at least one set of instructions for encoding configuration data obtained from the configuration memory via the internal configuration access port; and the peripheral interface for sending the configuration data encoded external to the programmable logic device.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

To facilitate understanding, identical reference numerals have been used, where possible, to designate identical elements that are common to the figures.

DETAILED DESCRIPTION OF THE DRAWINGS

Figure 1:
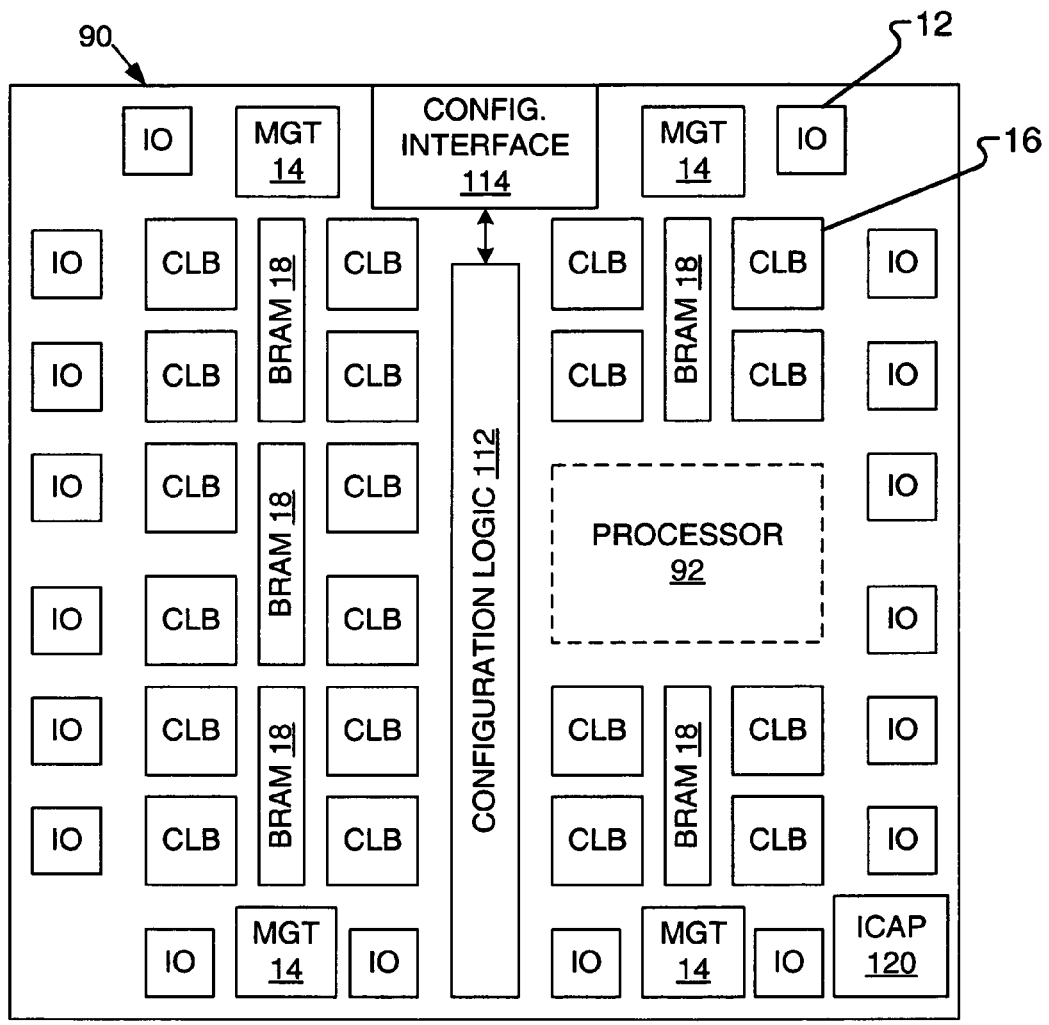
FIG. 1 is a block diagram depicting an exemplary embodiment of an FPGA.

FIG. 1 is a block diagram depicting an exemplary embodiment of an FPGA 90. FPGA 90 includes: input/output (I/O) blocks 12 (each labeled IO) located around the perimeter of FPGA 90, multi-gigabit transceivers (MGT) 14 interspersed with the I/O blocks, configurable logic blocks 16 (each labeled CLB) arranged in an array, block random access memory 18 (each labeled BRAM) interspersed with CLBs 16, configuration logic 112, configuration interface 114, on-chip processor 92, and internal configuration access port (ICAP) 120.

Processor 92 may be a dedicated ("embedded") processor or instantiated in configurable logic. Accordingly, as processor 92 may be instantiated in configurable logic as a "soft processor", it is shown with dashed lines. Notably, there can be more than one instance of processor 92 in programmable logic devices ("PLDs"). Notably, for a multiple processor embodiment, a designer may implement decoding in a processor and pass the decoded data to another processor which interfaces with ICAP 120 for reconfiguring FPGA 90.

Although FIG. 1 illustratively shows a relatively small number of I/O blocks, CLBs and BRAMs for purposes of illustration, it should be understood that an FPGA 90 conventionally includes many more of these elements. Additionally, FPGA 90 includes other elements, such as a programmable interconnect structure and a configuration memory array, which are not illustratively shown in FIG. 1. Additional details regarding an example of an FPGA are described in "Virtex-II™ Pro, Platform FPGA Handbook", (Oct. 14, 2002) which includes "Virtex-II Pro™ Platform FPGA Documentation" (March 2002) "Advance Product Specification," "Rocket I/O Transceiver User Guide", "PPC 405 User Manual" and "PPC 405 Processor Block Manual" available from Xilinx, Inc., 2100 Logic Drive, San Jose, Calif. 95124.

FPGA 90 is configured in response to a configuration information (commands and data) bitstream, which is loaded into a configuration memory array of FPGA 90 from an external memory, e.g., a read-only memory (ROM), via configuration interface 114 and configuration logic 112. Configuration interface 114 can be, for example, a select map interface, a JTAG interface, or a master serial interface.

Configuration memory may include columns of memory cells, where each column includes a plurality of bits. Configuration data is conventionally divided out into data frames. Configuration data may be loaded into the configuration memory array one frame at a time from external memory via configuration interface 114.

Figure 2:
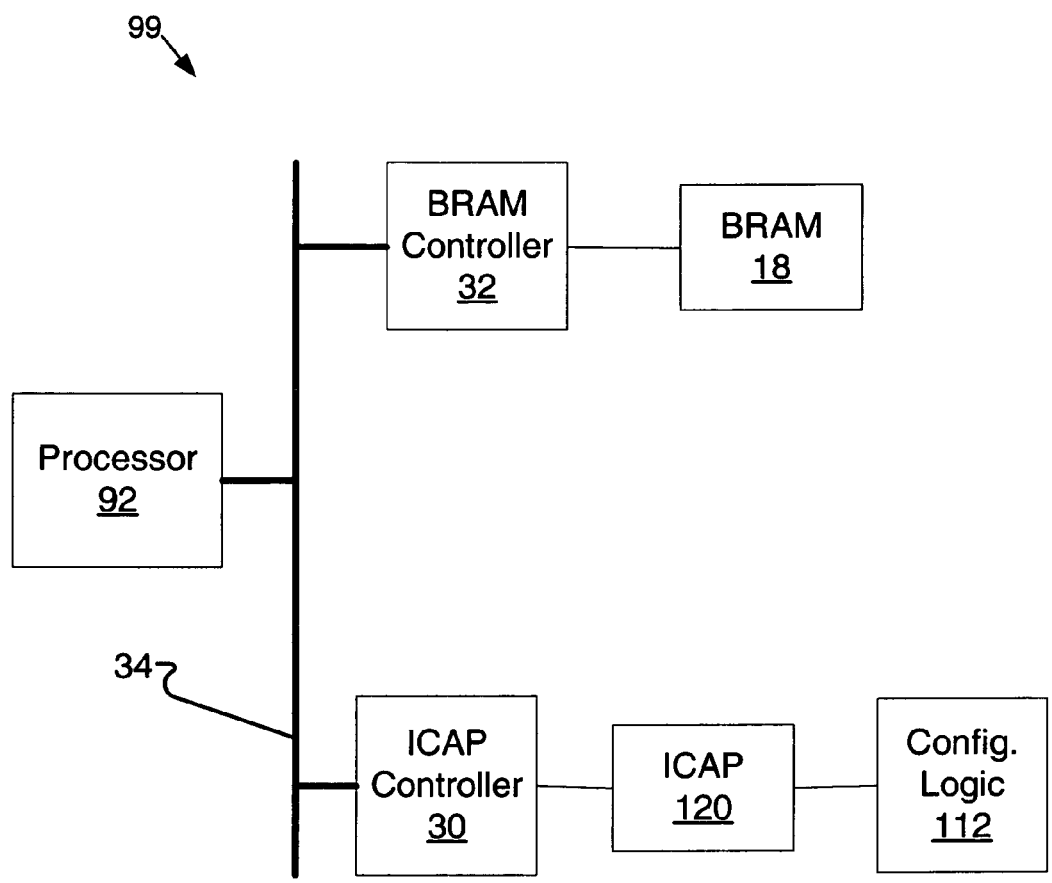
FIG. 2 is a block diagram depicting an exemplary embodiment of an internal configuration/reconfiguration ("configuration") interface.

FIG. 2 is a block diagram depicting an exemplary embodiment of an internal configuration/reconfiguration ("configuration") interface 99. Internal configuration interface 99 includes a processor 92, a BRAM controller 32, at least one BRAM 18, an ICAP controller 30, and ICAP 120, and configuration logic 112.

Processor 92 is coupled to BRAM controller 32 via bus 34 for access to BRAM 18. Processor 92 is coupled to ICAP controller 30 via busing or bus 34. Busing 34 may include a peripheral bus and a processor local bus, and may include a device control register bus. ICAP controller 30 provides data and control signals to ICAP 120 and receives from ICAP 120 data signals.

ICAP controller 30 and BRAM controller 32 are instantiated in configurable logic responsive to a boot core. In other words, a boot core includes configuration information, which may be provided to FPGA 90 via configuration interface 114, for instantiating in configurable logic and programmable interconnects BRAM controller 32 and ICAP controller 30, and interconnects for them. Notably, though the term "boot" core is used, it should be appreciated that after booting FPGA 90 using one or more boot cores, a user may partially configure/reconfigure FPGA 90. This partial reconfiguration may include sending encoded configuration data to FPGA 90 which is then decoded by: circuitry previously instantiated in FPGA 90 by such one or more boot cores; or by circuitry previously instantiated in FPGA 90 by one or more boot cores and then partially reconfigured by one or more boot cores. Additionally, a "boot" core, for example for encoding or decoding configuration data, may be instantiated and then removed, and then subsequently instantiated and removed without rebooting FPGA 90. In other words, a boot core may, though need not, be employed at boot up of FPGA 90. Accordingly, the term "boot" is not limited to the time of booting FPGA 90, as a boot core may be used after booting FPGA 90 and instantiated circuitry may be configured and reconfigured post-booting of FPGA 90.

Figure 3:
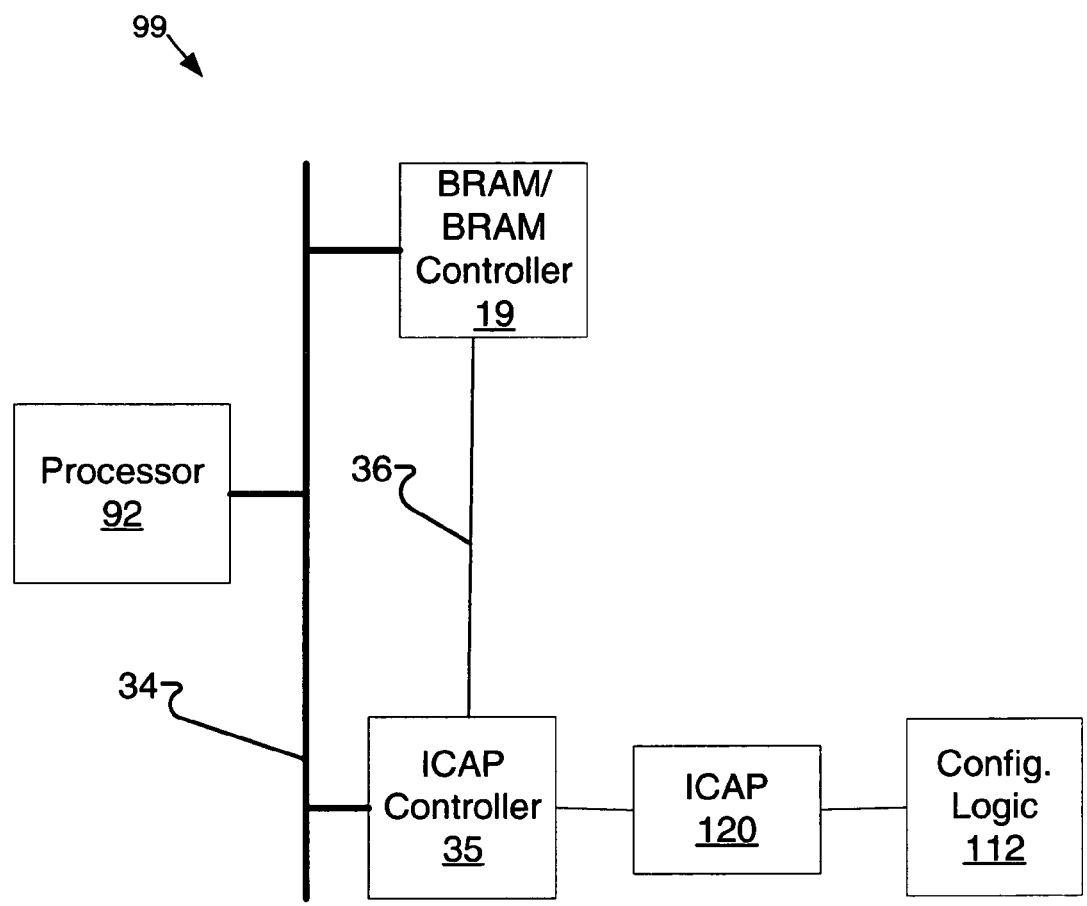
FIG. 3 is a block diagram depicting another exemplary embodiment of the internal configuration interface of FIG. 2.

FIG. 3 is a block diagram depicting another exemplary embodiment of internal configuration interface 99. Processor 92 is coupled to a BRAM controller/BRAM module 19 and ICAP controller 35 via bus 34. BRAM controller/BRAM module 19 includes one or more BRAMs 18 and includes BRAM controller 32 of FIG. 2. However, in this embodiment, BRAM controller 32 of BRAM controller/BRAM module 19 is provided as dedicated or application specific circuitry and not instantiated in configurable logic. ICAP controller 35 is coupled to ICAP 120. ICAP 120 is coupled to a configuration memory array via configuration logic 112.

ICAP controller 35 is coupled to BRAM controller/BRAM module 19 via a separate bus 36 to facilitate data transfer without using processor bus 34. It should be understood that ICAP controller 35 is instantiated in configurable logic and programmable interconnects responsive to a boot core.

It should be understood that a Xilinx ICAP processor interface ("XIPPI") is an example of an internal configuration interface. Additional details regarding the "XIPPI" technology may be found in a co-pending patent application entitled "RECONFIGURATION OF THE PROGRAMMABLE LOGIC OF AN INTEGRATED CIRCUIT", by Brandon J. Blodget, et al., U.S. patent application Ser. No. 10/377,857, filed Feb. 28, 2003, and assigned to a common assignee, which co-pending application is incorporated herein by reference in its entirety. It should be understood that there are libraries, such as XIPPI libraries, which may be used to configure or reconfigure FPGA 90.

Figure 4A:
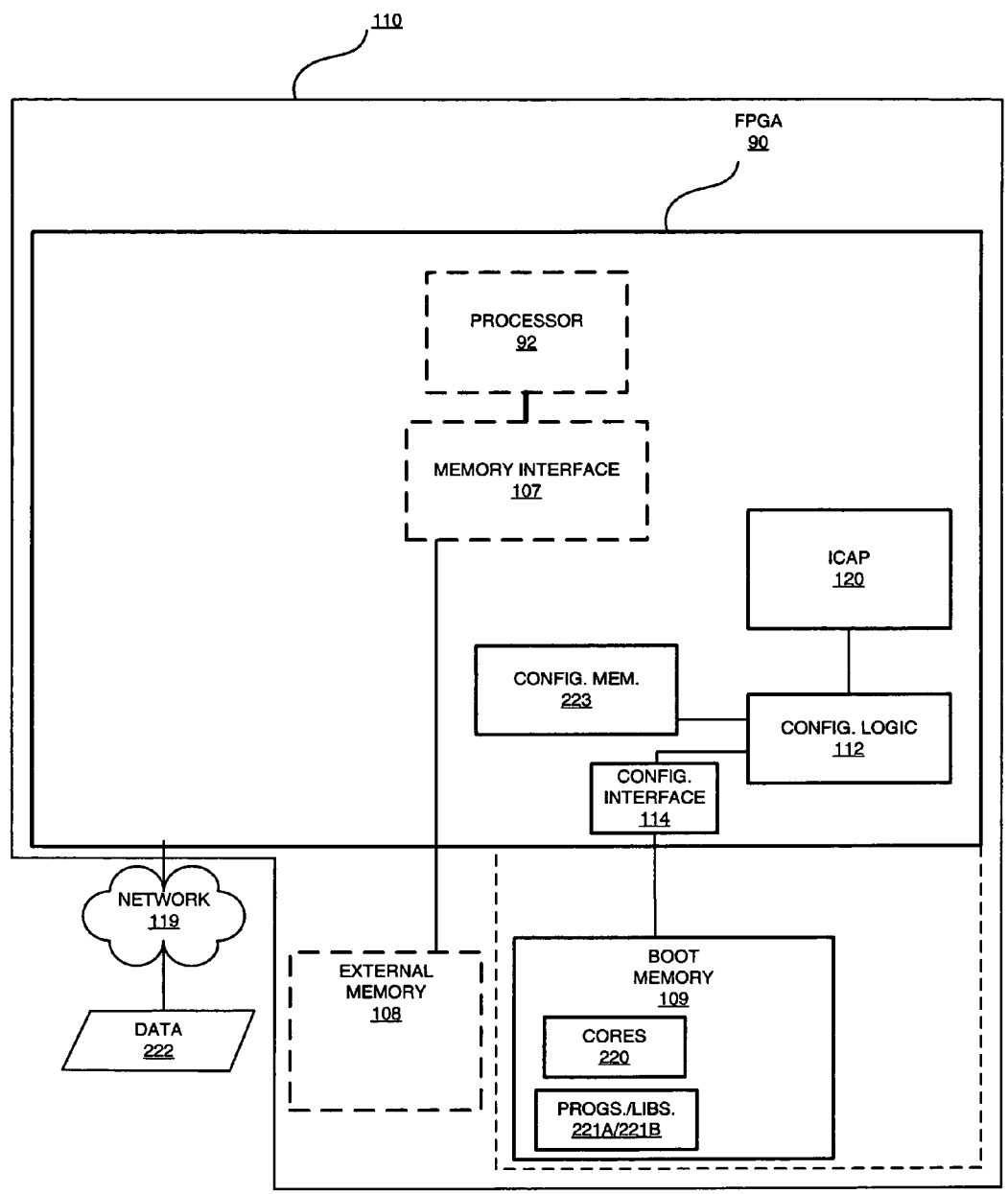
FIGS. 4A and 4B are block diagrams depicting respective exemplary embodiments of an FPGA system prior to loading boot cores.

FIG. 4A is a block diagram depicting an exemplary embodiment of FPGA system 110 prior to loading boot cores. FPGA system 110 includes FPGA 90 coupled to boot memory 109. Boot memory 109 may be a programmable read-only memory ("PROM") or other well-known form of memory suitable for storing one or more cores 220. Alternatively, boot memory 109 may be part of FPGA 90, as indicated with dashed lines. Optionally, additional memory 108, such as random access memory ("RAM") or other well-known form of memory suitable for storing program information, may be coupled to FPGA 90, for reasons which are explained below in additional detail. Memory 108 is optional as programs may be completely stored in FPGA 90 internal memory, including BRAMs. Loading of one or more programs into BRAM may be part of a boot core. If additional memory is needed for program or data storage, external memory may used to store for such buffer storage, where such external memory may be viewed as a well-known peripheral for processor 92 having a well-known interface.

In an embodiment, FPGA 90 may be put in communication with network 119 for access to data 222 stored in data memory. Alternatively, network 119 may be omitted and data memory 101 having data 222 may be directly connected or connected through a bus, namely, direct-connect or bus 224, to FPGA 90, as illustratively shown in the block diagram of FIG. 4B which depicts another exemplary embodiment of FPGA system 110 prior to loading boot cores. As connection 224 is well known, such as a media access controller, a Universal Serial Bus ("USB"), and a modem/Universal Asynchronous Receiver Transceiver ("UART"), among other types of connections, connection 224 is not described herein in detail.

Figure 4B:
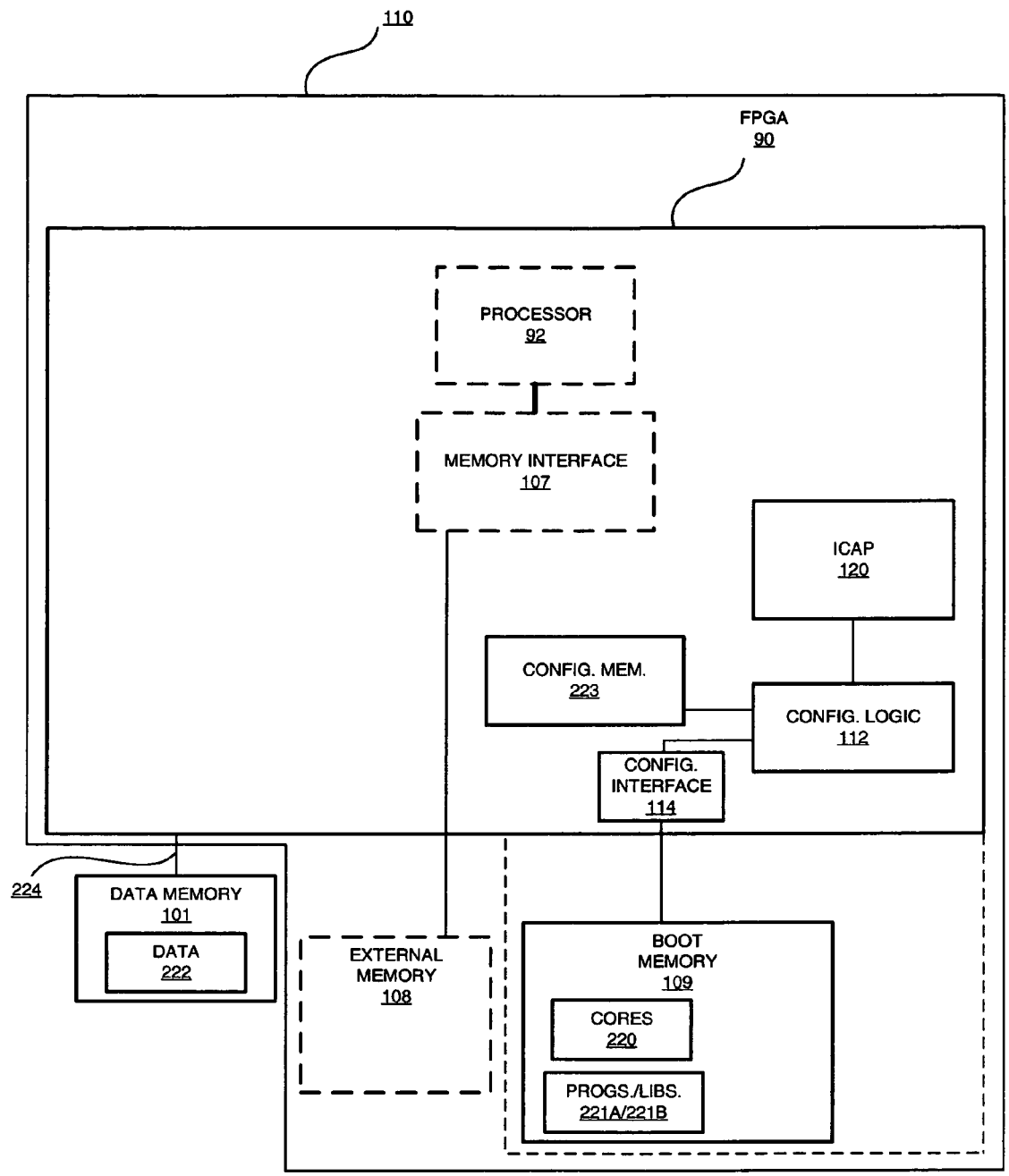

With simultaneous reference to FIGS. 4A and 4B, FPGA system 110 is further described. Processor 92 and memory interface 107, including interconnects, may be formed as application specific circuitry of FPGA 90, or may be part of a boot core for instantiating in configurable logic and programmable interconnects. For clarity, it will be assumed that processor 92 and memory interface 107 are part of a boot core, though they may be dedicated circuitry.

Figure 5A:
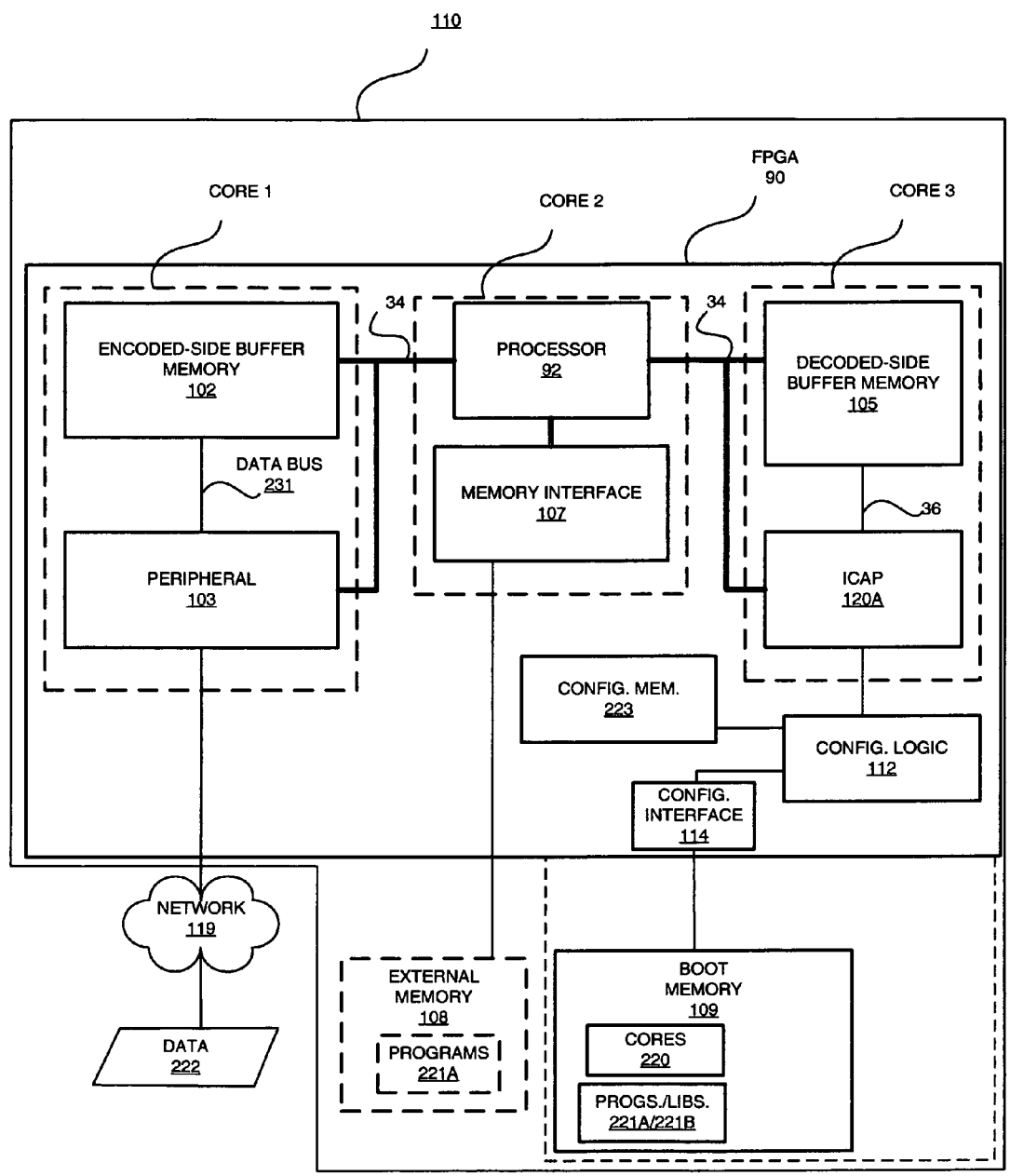
FIGS. 5A and 5B are block diagrams depicting exemplary embodiments of the FPGA system of FIGS. 4A and 4B, respectively, after instantiating circuitry responsive to boot cores.
Figure 5B:
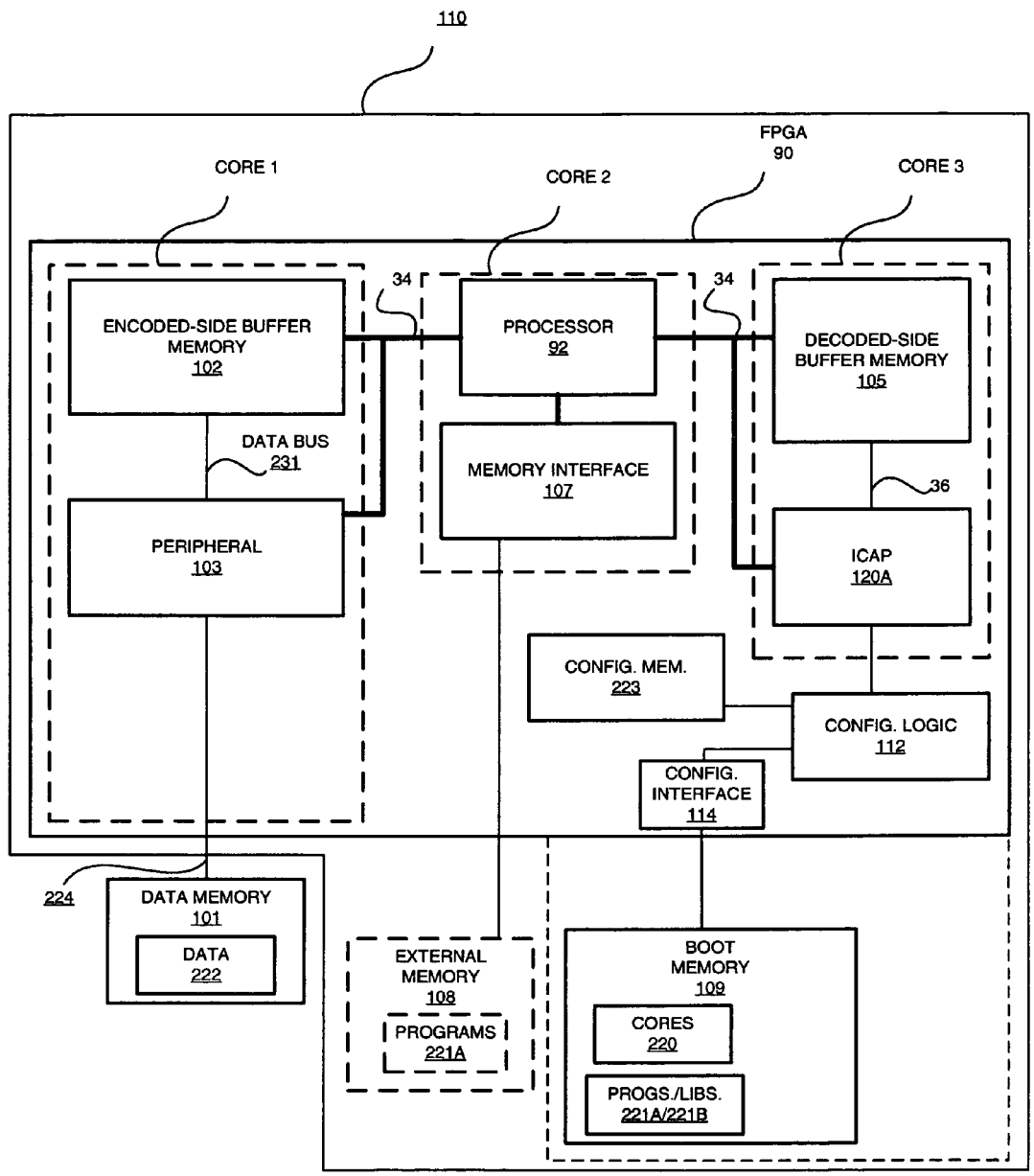

FIG. 5A is a block diagram depicting an exemplary embodiment of FPGA system 110 in communication via network 119 to obtain data 222 after instantiating circuitry as part of boot cores 220. FIG. 5B is a block diagram depicting an exemplary embodiment of FPGA system 110 in direct or bussed communication with data memory 101, containing encoded configuration data 222, after instantiating circuitry as part of boot cores 220. With simultaneous reference to FIGS. 5A and 5B, FPGA system 110 is further described.

Boot cores 220 are used to provide boot cores 1, 2 and 3, namely, boot cores configured in a PLD, such as FPGA 90. Boot cores 1, 2 and 3 may be conventionally instantiated via providing a configuration bitstream to configuration interface 114. Notably, if programs or libraries are stored in internal memory of FPGA 90, such as BRAM, then such programs 221A or libraries 221B may be provided as part of a configuration bitstream along with configuration bitstreams for boot cores, such as boot cores 1, 2 and 3. It should be understood that a boot core is a configuration bitstream.

Core 1 provides a peripheral, or more particularly a peripheral interface, 103, and a data bus 231. Data bus 231, like data bus 36, is to BRAM, which for this embodiment is labeled encoded-side buffer memory 102. Accordingly, data bus 231 couples peripheral 103 with buffer memory 102. Core 1 is a configuration decoder core.

It should be appreciated that peripheral interface 103 may be instantiated according to the type of peripheral on system 110. For example, peripheral 103 may be any of a variety of well-know interfaces, including but not limited to Ethernet, Universal Serial Bus ("USB"), FireWire, and Peripheral Component Interconnect ("PCI"), among others. For example, if system 110 includes an Ethernet socket, then peripheral 103 would be an Ethernet peripheral; if system 110 includes a USB socket, then peripheral 103 would be a USB peripheral; and if system 110 includes an edge connector for a PCI bus, then peripheral 103 would be a PCI peripheral. For purposes of clarity, it will be assumed that peripheral 103 is an Ethernet interface, namely, a medium access control/physical ("MAC/PHY") interface, for communication over network 119. Thus, peripheral 103 may be used for establishing a network session between FPGA 90 and network 119.

FPGA 90, with Core 1 instantiated, has access to data 222. For this embodiment, it should be understood that data 222 is encoded configuration data. By encoded, it should be understood that data 222 may include, but is not limited to, data that is encrypted or compressed or both. By encoded, it should also be understood that data 222 may include, but is not limited to, virtual architecture designs, legacy designs or other device-specific FPGA configuration data formats.

Core 2, configured in a PLD, provides processor 92 and memory interface 107 and interconnects associated therewith. Memory 102 and peripheral 103 may be coupled to processor 92 via bus 34, and processor 92 may be separately coupled to memory interface 107 for access to external memory 108. External memory 108 may be used as additional memory of FPGA 90 for storing programs 221 or program-data to be run using processor 92. Alternatively, if FPGA 90 has a sufficient amount of internal memory, such as BRAM, for running programs 221 or storing the program-data, external memory 108 may be omitted.

Again, processor 92 may be embedded circuitry, and thus Core 2 may be omitted. For clarity, it will be assumed that processor 92 and memory interface 92 are instantiated responsive to Core 2, though other embodiments may be used. Accordingly, Core 2 is a processor/memory interface core.

Core 3, configured in a PLD, provides access to ICAP 120, as previously described with reference to FIG. 3, by providing ICAP control module 35, as well as interconnects. ICAP block 120A includes ICAP 120 and ICAP control module 35 for this embodiment. Notably, though core 3 is for internal configuration interface 99 of FIG. 3, internal configuration interface 99 of FIG. 2 may alternatively be used. For this embodiment, BRAM control/BRAM module 19 is labeled decoded-side buffer memory 105. Core 3 is an ICAP processor interface core, as described in additional detail in previously cited patent application entitled "RECONFIGURATION OF THE PROGRAMMABLE LOGIC OF AN INTEGRATED CIRCUIT", by Brandon J. Blodget et al.

Figure 6A:
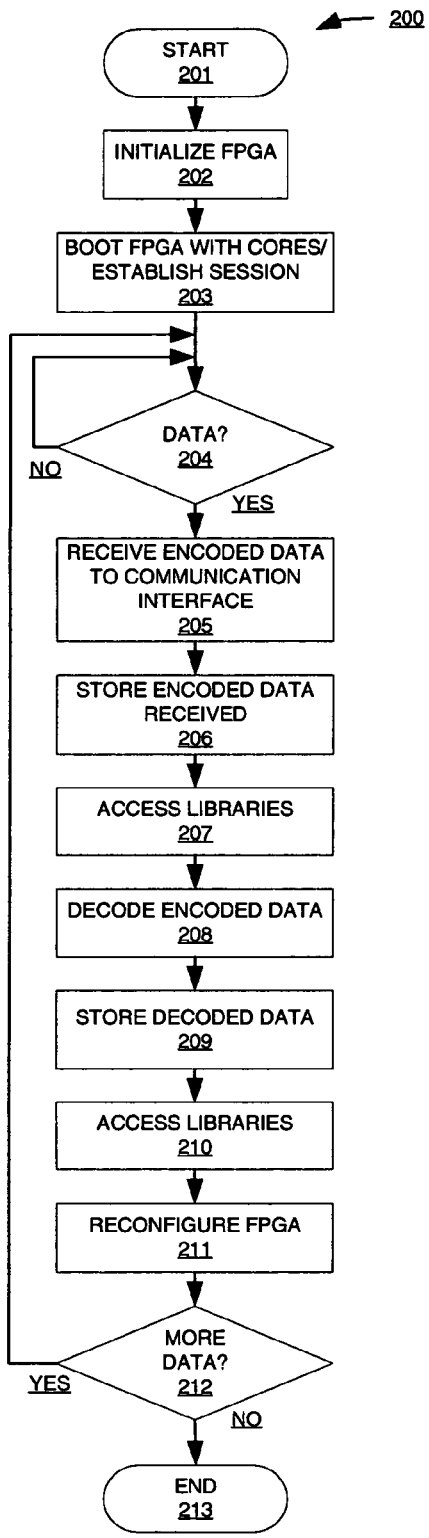
FIGS. 6A and 6B are flow diagrams depicting respective exemplary embodiments of FGPA configuration flows.

FIG. 6A is a flow diagram depicting an exemplary embodiment of an FGPA configuration flow 200. With continuing reference to FIG. 6A and renewed reference to FIGS. 5A and 5B, FPGA configuration flow 200 is described.

At 201, FPGA configuration flow 200 is begun. At 202, FPGA 90 is powered-up and initialized.

At 203, FPGA 90 is booted with cores 220 obtained from boot memory 109 via configuration interface 114. Once booted with cores 220, a network session is established for communication via network 119. Alternatively, a communication session may be established for direct or bussed communication between an external data memory 101 and FPGA 90.

For example, FPGA 90, once booted with a configuration decoder core 1, a processor/memory core 2 and an ICAP interface core 3, can communicate for access to data 222 via network 119, such as obtaining data 222 from a server computer. Notably, data memory 101 may be any known form of integrated circuit memory, disk memory (e.g., optical and magnetic) or other known memory. For example, presently, there are USB external integrated circuit memory drives and USB external disk memory drives which may be plugged into a USB port.

Programs 221 may be for resolving FPGA configuration data stored in one or more encoded formats. Accordingly, one or more of programs 221 may be for decompression, decryption, virtual architecture design decoding, and legacy design decoding, among other types of programs for resolving encoded data. Examples of encryption/decryption algorithms include those for triple-DES, RSA, AES, ElGamal, and DEA, among others. Examples of compression/decompression algorithms include Shannon-Fano, Universal, Arithmetic, Huffman, Lempel-Ziv-Welch ("LZW"), Bentley-Sleator-Tarjan-Wei ("BSTW"), Faller-Gallager-Knuth ("FGK"), and Run Length Encoding ("RLE"), among others. For purposes of clarity, it is assumed that data 222 stored in data memory 101 is in encrypted and compressed data, which is to be decoded into a configuration data format for reconfiguration of FPGA 90, though other embodiments may be used depending on how data 222 is encoded.

Data 222 in data memory 101 is communicated to FPGA 90 via peripheral 103. It should be appreciated that design data or configuration data, for example, which may be stored in data memory 101, may be substantially voluminous. Accordingly, there may not be sufficient internal memory in FPGA 90 to buffer all of such data, and thus handshaking may be used with data memory 101 for synchronization.

It should be understood that once boot cores 1, 2 and 3 are loaded from boot memory 109, ICAP 120A may be used to configure or reconfigure FPGA 90, except for those regions reserved for cores 1, 2 and 3. For example, when design data 222 is decoded into configuration data, as described below, such decoded configuration data may be in the form of a conventional bitstream used for configuring (unused configurable logic) or reconfiguring (previously used configurable logic) [herein collectively and singly referred to as "reconfiguring"] FPGA 90 via ICAP 120A.

At 204, FPGA 90 waits for data 222 to be received. At 205, data 222, which in this example is encoded configuration data, is transferred from data memory 101 to FPGA 90.

At 206, data 222 may be buffered or temporarily stored in encoded-side buffer memory 102. Alternatively, data 222 may be provided to processor block 92 via bus 34 without first buffering in memory 102.

At 207, programs 221A are accessed by processor 92 from memory 109 in response to format of data 222. For example, peripheral 103 or processor block 92 may determine whether data 222 is encrypted or compressed or both. For example, peripheral 103 may interrogate a data packet to determine if it is compressed and the type of compression used, and in response to finding out this information, a decompression library would be selected for the type of compression used to compress data 222.

Continuing the above example of encrypted and compressed configuration data, processor 104 would access memory 109 to obtain programs from programs 221A for decompressing and decrypting received data 222. Notably, there are many known encryption and compression algorithms, and thus there are many known corresponding decryption and decompression algorithms. By having a store of programs 221A capable of handling different types of encryption and compression, data adaptability of FPGA 90 is facilitated as any of a variety of encrypted and compressed data formats may be used for data 222. Libraries 221B include ICAP processor interface libraries, such as XIPPI libraries for Xilinx FPGAs with an ICAP, for reasons set forth below in additional detail.

Figure 5C:
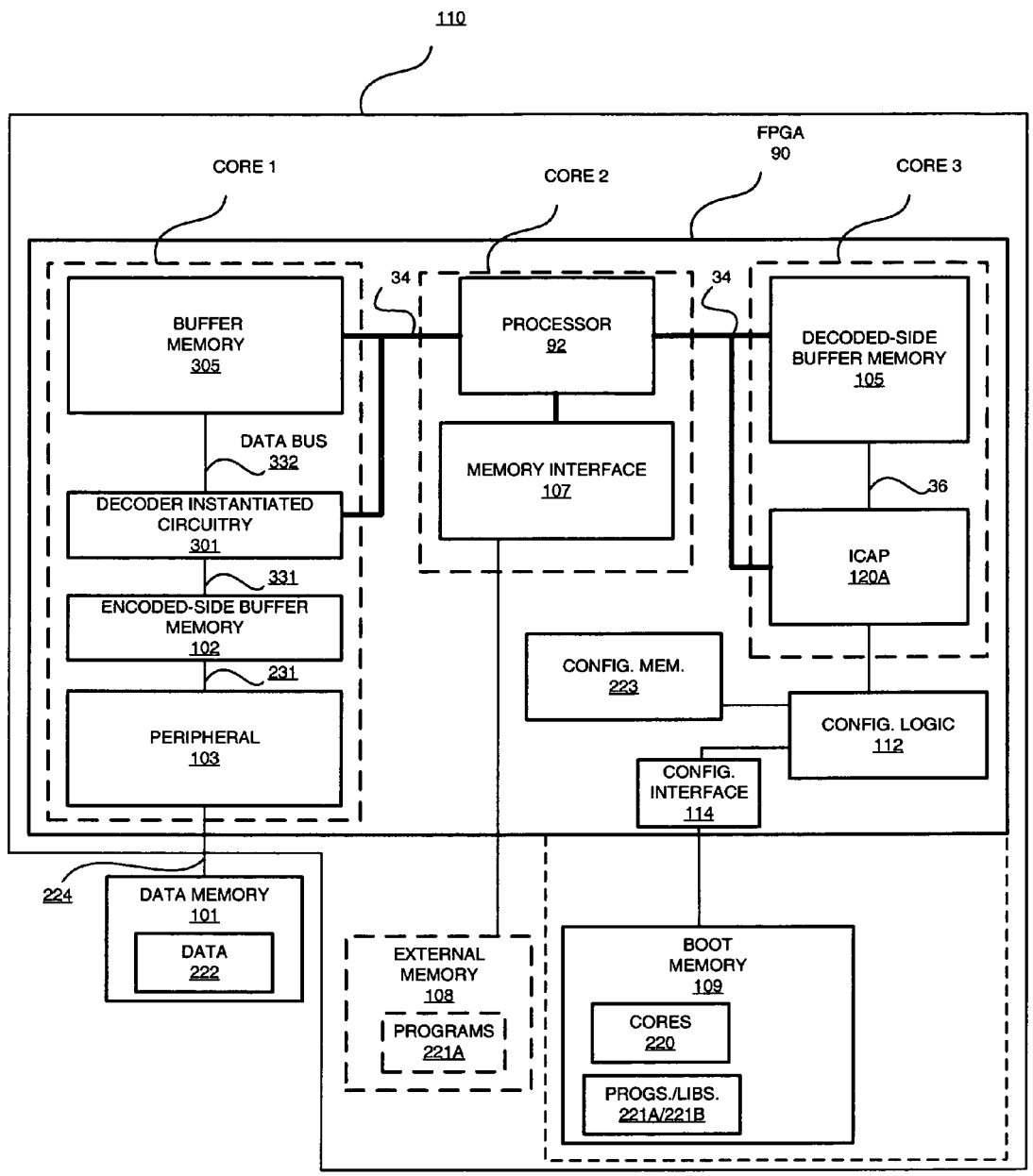

FIG. 5C is a block diagram depicting an exemplary embodiment of FPGA system 110 in direct or bussed communication with data memory 101 containing encoded configuration data 222, after instantiating circuitry including decoder instantiated circuitry 301 as part of boot cores 220. FIG. 5C is similar to FIG. 5B except for example core 1 includes decoder instantiated circuitry 301. In this embodiment, peripheral 103 is coupled to encoded-side buffer memory 102 as before; however, bus 34 is coupled to decoder instantiated circuitry 301 and decoded-side buffer memory 305.

After receiving encoded configuration data 222, peripheral 103 may buffer such encoded configuration data 222 in encoded-side buffer memory 102 via data bus 231. Data bus 231 may couple encoded-side buffer memory 102 to decoder instantiated circuitry 301. For a data-encoded format which is predetermined or identified by a header of configuration data 222, appropriate decoding libraries can be preloaded or loaded, as applicable, to instantiate core 1 having decoder instantiated circuitry 301. Thus, rather than having these libraries as software running on processor 92, such libraries may be used to provide software programmed decoder circuitry ("soft circuitry") configured as part of configuration of FPGA 90. Such soft circuitry may be part of a boot core or be configured/reconfigured responsive to a format or formats of encoded configuration data 222 being determined.

Buffered encoded configuration data 222 in memory 102 is obtained via data bus 331 to decoder instantiated circuitry ("decoder") 301. Decoder 301 decodes encoded configuration data to provide decoded configuration data. Decoded configuration data may be buffered in decoded-side buffer memory 105 via bus 34 for access by ICAP 120A. Alternatively, decoded configuration data may be buffered in buffer memory 305 via data bus 332.

Buffer memory 305 may be connected to bus 34 for access by ICAP 120A. Notably, memory 102, 105 and 305 may be one in the same memory, and may be one in the same memory address space. For example, buffered encoded configuration data obtained for decoding may be written back to the memory address space from which it was obtained. ICAP 120A may be instructed to obtain the decoded data from such memory address space. However, for purposes of clarity and not limitation, separate memory address spaces are described for encoded and decoded configuration data.

Accordingly, though decoding may be done with decoder 301, for purposes of clarity and not limitation FGPA configuration flow 200 is described in terms of running decoding programming on processor 92. Returning to FIGS. 5A, 5B and 6A, at 208, processor 92 decodes data 222, and at 209 such decoded data 222 is temporarily stored in decoded-side buffer memory 105. Whether converted, decrypted or decompressed, or otherwise decoded, data 222 is stored as configuration data in memory 105 for providing a configuration bitstream to ICAP block 120A.

At 210, one or more ICAP processor interface libraries 221B, such as XIPPI libraries, are accessed for writing configuration data 222 to configuration memory of FPGA 90. Such libraries are well-known, and are described in additional detail in previously cited patent application entitled "RECONFIGURATION OF THE PROGRAMMABLE LOGIC OF AN INTEGRATED CIRCUIT", by Brandon J. Blodget et al.

At 211, configuration data in memory 105 is obtained by ICAP block 120A, such as via data bus 36, for writing to configuration memory 223 via configuration logic 112 under control of processor 92 running an ICAP processor interface library or libraries 221B. Notably, this may involve a read-modify-write sequence, as described in additional detail in previously cited patent application entitled "RECONFIGURATION OF THE PROGRAMMABLE LOGIC OF AN INTEGRATED CIRCUIT", by Brandon J. Blodget et al.

It should be appreciated that because reconfiguration is under software control, a library 221B may be written as a program or loop in a program for carrying out an increment and repeat instruction set. Notably, a library 221B, such as a XIPPI library, may be used to hide lower-level details to facilitate higher-level application programming, or may involve lower-level configuration memory access details.

At 211, FPGA 90 is reconfigured with configuration data written to configuration memory. Again, FPGA 90 may be configured, reconfigured, partially reconfigured or the like with such configuration data.

Furthermore, it should be appreciated that reconfiguration may be done while FPGA 90 is in an operable mode ("on-the-fly reconfiguration" or "dynamic reconfiguration"), such as when FPGA 90 is functioning in a user configured mode. Additionally, by accessing configuration data externally, such as over network 119, FPGA 90 becomes self-configuring for any of a variety of known or predetermined encoded formats.

To prevent overwriting a boot core or cores with configuration data, configuration memory address space used for such boot core or cores, as well as address space for memories 102 and 105, may be reserved in FPGA 90 as part of boot core instantiation. To facilitate reserving boot core address space, boot core instantiation may be substantially localized and confined to a region of an FPGA, such as to a section of FPGA 90.

However, because one or more FPGA 90 global resources, such as clock buffers, may be used for instantiating a boot core of boot cores 220, location of boot core configuration bits outside of a reserved boot core section may be identified to prevent against them being overwritten. Which resources are used by a boot core may be identified from a configuration bitstream, such as by frame number and bit offsets within a frame. Accordingly, if a frame number is taken by a boot core, such frame number is not available for reconfiguration. An application programmer may be informed of what resources are being used by a boot core to avoid use of those resources. Identification of bits associated with circuitry, such as a boot core, are found in co-pending U.S. patent application Ser. No. 10/917,033 entitled "Method and System for Identifying Essential Configuration Bits" by Cameron D. Patterson et al., filed Aug. 12, 2004, and assigned to a common assignee, which co-pending application is incorporated herein by reference in its entirety.

At 212, a check is made for more data 222 to decode for configuring FPGA 90. If there is no more data 222 to decode, then FPGA configuration flow 200 ends at 213. Otherwise, if there is more data 222 to decode, FPGA configuration flow 200 waits for such other data at 204.

Figure 6B:
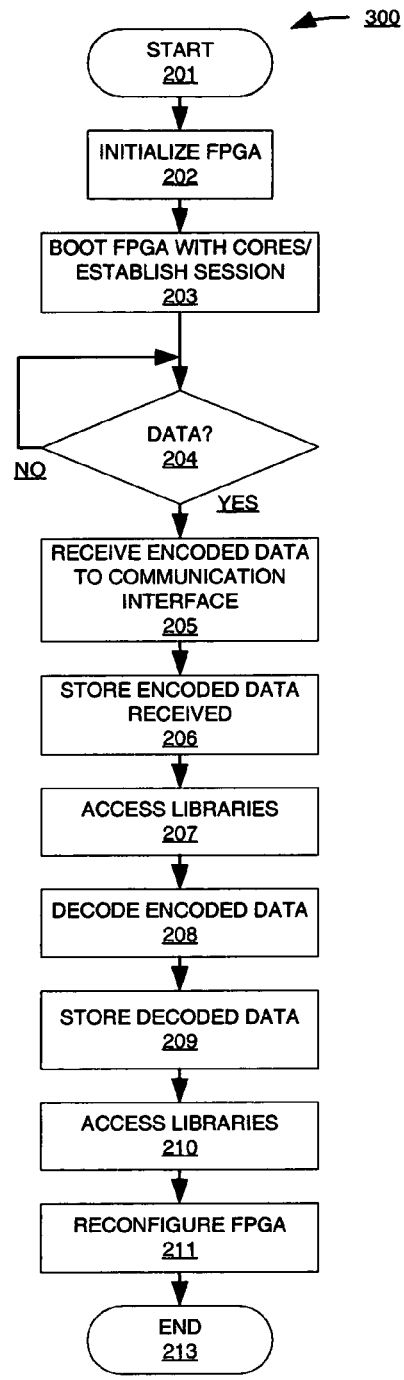

FIG. 6B is a flow diagram depicting an exemplary embodiment of another FGPA configuration flow 300. FPGA configuration flow 300 is similar to FPGA configuration flow 200, and accordingly description of same elements is not repeated here.

With continuing reference to FIG. 6B and renewed reference to FIGS. 5A and 5B, FPGA configuration flow 300 is described. If memory 102 is sufficiently large such that all of data 222 may go from being stored in memory 102 to being written to configuration memory 223, then a check for more data at 212 as in FIG. 6A may be avoided. This may further be facilitated by use of dual port memories for memories 102 and 105, such as dual ported BRAMs.

Notably, though memories 108 and 109 are illustratively shown external to FPGA 90, one or both of them may be embedded within FPGA 90. In which embodiment, memory 109 may be flash memory or other memory having a semiconductor process flow that may be integrated with the semiconductor process flow of FPGA 90.

It should be appreciated that once CLB and programmable interconnect resources for instantiating cores 1, 2 or 3 are no longer needed or may be unused for some period of time, such resources may be returned to a pool of resources. Thus, integrated circuit space, which heretofore was consumed by dedicated resources, may now be reused. Alternatively, though a processor was used for decoding encoded data, depending on the type of encoding, a state machine or sequencer may be used instead of a processor. Furthermore, depending on the type of encryption used, one or more decryption keys or passwords 224, stored in internal memory of FPGA 90 or external memory to FPGA 90, such as boot memory 109, may be accessed by a decryption program 221A.

Accordingly, it should be appreciated that processor means internal to a programmable logic device may receive encoded data, decode the encoded data into configuration data, and internally reconfigure the programmable logic device with the configuration data. It should further be understood that configuration data may be read from configuration memory by internal processor means of the programmable logic device.

Figure 7:
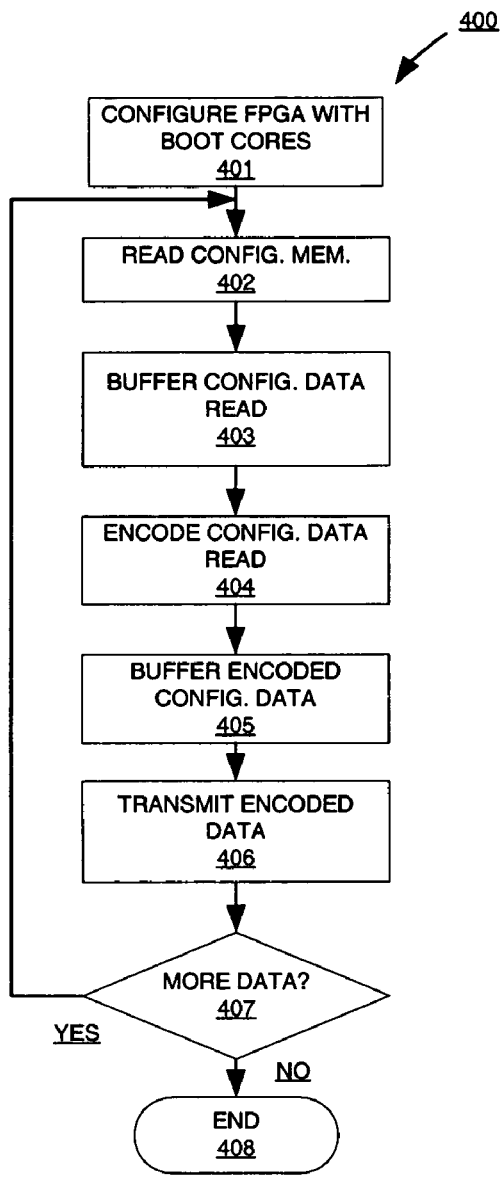
FIG. 7 is a flow diagram depicting an exemplary embodiment of an FPGA configuration memory readback flow.

FIG. 7 is a flow diagram depicting an exemplary embodiment of an FPGA configuration memory readback flow 400. Configuration readback involves reading data from FPGA configuration memory. Configuration readback may be performed to verify the integrity of configuration data stored in configuration memory or to obtain the state of a design at a given instant of time. With continuing reference to FIG. 7 and renewed reference to FIGS. 5A and 5B, FPGA configuration reporting flow 400 is further described.

At 401, if needed boot cores, such as boot cores 1, 2 and 3, are not already instantiated for obtaining configuration data, they are instantiated at 401.

At 402, processor 92 initiates a read via ICAP 120A of configuration memory 223. This read may be initiated by processor 92 obtaining a library 221B for reading configuration memory 223.

At 403, configuration data read at 402 is buffered in decoded-side buffer memory 105.

At 404, processor 92 accesses one or more programs 221A for encoding configuration data read at 402. For example, processor may obtain programs 221A for compressing data, encoding data for error correction, and encrypting data, among other types of data encoding. Processor 92 accesses buffered configuration data read from buffer memory 105 and encodes such data using one or more programs 221A.

Figure 5D:
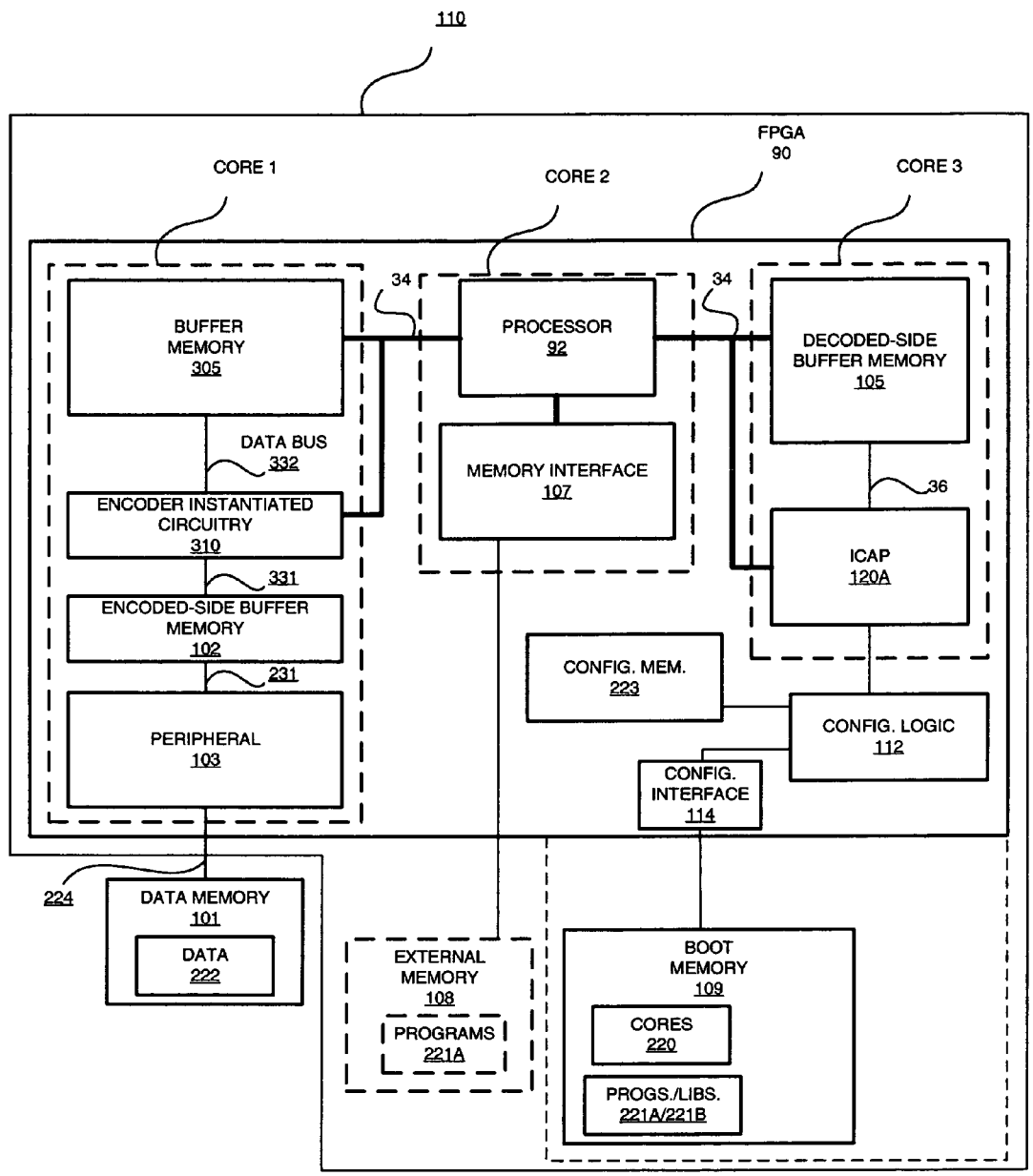

Alternatively, as illustratively shown in the block diagram of FIG. 5D depicting an exemplary embodiment of FPGA system 110 in direct or bussed communication with data memory 101, after instantiating circuitry including encoder instantiated circuitry 310 as part of boot cores 220. In other words, boot cores 220 may include an encoder core. FIG. 5D is similar to FIG. 5C except for example core 1 includes encoder instantiated circuitry 310 in place of decoder 301.

After reading back configuration data, encoder 310 encodes such readback configuration data. For a data-encoded format which is predetermined, appropriate encoding libraries can be preloaded or loaded, as applicable, to instantiate core 1 having encoder instantiated circuitry 310. Thus, rather than having these libraries as software running on processor 92, such libraries may be used to provide software programmed encoder circuitry ("soft circuitry") configured as part of configuration of FPGA 90. Such soft circuitry may be part of a boot core or be configured/reconfigured responsive to a format instruction to FPGA 90.

Accordingly, though encoding may be done with encoder 310, for purposes of clarity and not limitation FPGA configuration memory readback flow 400 is described in terms of running encoding programming on processor 92. Returning to FIGS. 5A, 5B and 6B, at 405, processor 92 stores encoded configuration data in buffer memory 102.

At 406, peripheral 103 obtains encoded configuration data from buffer memory 102 and transmits such encoded configuration data external to FPGA 90, such as via network 119 or other means disclosed herein, to data memory 101. Notably, peripheral 103 may establish a communication session, such as a networking session, according to an established protocol for this transmission.

At 402, a first frame of configuration data may be read from configuration memory 223 via ICAP 120A. Accordingly, at 407, a check for another frame of data to be read from configuration memory 223 may be made. If there is another frame of configuration data to be read, FPGA configuration reporting flow 400 may loop back to 402 to read another frame of configuration data; otherwise, FPGA configuration reporting flow 400 ends at 408.

While the foregoing describes exemplary embodiment(s) in accordance with one or more aspects of the invention, other and further embodiment(s) in accordance with the one or more aspects of the invention may be devised without departing from the scope thereof, which is determined by the claim (s) that follow and equivalents thereof. Claim(s) listing steps do not imply any order of the steps. Trademarks are the property of their respective owners.

The invention claimed is:

1. A method for sending encoded data from an integrated circuit device, comprising:
   accessing at least one boot core with the integrated circuit device, the at least one boot core for configuring the integrated circuit device;
   configuring the integrated circuit device responsive to the at least one boot core accessed that provides a peripheral interface internal to the integrated circuit device;
   obtaining configuration data written to configuration memory, output of the configuration memory for directly controlling states of programmable gates of the integrated circuit device, the configuration data obtained via an internal interface of the integrated circuit device;

the internal interface being a configuration access port internal to the integrated circuit device and configurable for internally reading back the configuration data written to the configuration memory without having to export the configuration data read from the configuration memory of the integrated circuit device as part of the reading back;

accessing a set of instructions by a processing device internal to the integrated circuit device;

encoding by the processing device the configuration data with the set of instructions to provide encoded configuration data;

the encoding being performed internally with respect to the integrated circuit device; and sending the encoded configuration data via the peripheral interface.

2. The method, according to claim 1, wherein the set of instructions is an encryption program.

3. The method, according to claim 1, wherein the set of instructions is a compression program.

4. The method, according to claim 1, wherein the set of instructions is an error-checking program.

5. The method, according to claim 1, further comprising buffering the configuration data and the encoded configuration data.

6. The method, according to claim 1, further comprising configuring the integrated circuit device responsive to a processor core to instantiate the processing device in a programmable logic.

7. The method, according to claim 5, wherein the processing device is selected from a microprocessor.

8. The method, according to claim 5, wherein the processing device is a state machine.

9. The method, according to claim 1, wherein the processing device is a microprocessor embedded in the integrated circuit device, and wherein the integrated circuit device is a field programmable gate array.

10. The method, according to claim 1, wherein the peripheral interface is selected from Ethernet, Universal Serial Bus, FireWire, and Peripheral Component Interconnect.

11. A method for sending encoded data from an integrated circuit device, comprising:

accessing at least one boot core with the integrated circuit device, the at least one boot core for configuring the integrated circuit device;

configuring the integrated circuit device responsive to the at least one boot core accessed that provides a peripheral interface and an encoder internal to the integrated circuit device;

obtaining configuration data written to configuration memory, output of the configuration memory for directly controlling states of programmable gates of the integrated circuit device, the configuration data obtained via an internal interface of the integrated circuit device;

the internal interface being a configuration access port internal to the integrated circuit device and configurable for internally reading back the configuration data written to the configuration memory without having to export the configuration data read from the configuration memory of the integrated circuit device as part of the reading back;

encoding by the encoder the configuration data to provide encoded configuration data;

the encoding being performed internally with respect to the integrated circuit device; and sending the encoded configuration data via the peripheral interface.

12. The method, according to claim 11, wherein the encoding is done responsive to a set of instruction for encryption.

13. The method, according to claim 11, wherein the encoding is done responsive to a set of instruction for compression.

14. The method, according to claim 11, wherein the encoding is done responsive to a set of instruction for error-checking.

15. The method, according to claim 11, further comprising buffering the configuration data and the encoded configuration data.

16. The method, according to claim 11, further comprising configuring the integrated circuit device responsive to a processor core to instantiate a processing device in a programmable logic.

17. The method, according to claim 16, wherein the processing device is a microprocessor.

18. The method, according to claim 16, wherein the processing device is a state machine.

19. The method, according to claim 11, further comprising a microprocessor embedded in the integrated circuit device, wherein the integrated circuit device is a field programmable gate array.

20. The method, according to claim 11, wherein the peripheral interface is selected from Ethernet, Universal Serial Bus, FireWire, and Peripheral Component Interconnect.

21. A system for decoding configuration data, comprising:

an integrated circuit device having an internal configuration access port, configuration memory, a configuration interface and configuration resources;

boot memory coupled to the configuration interface of the integrated circuit device;

the boot memory containing boot cores for writing to the configuration memory via the configuration interface and the configuration resources to configure the integrated circuit device;

the boot cores including an encoder core;

the encoder core for providing a peripheral interface and an encoder internal to the integrated circuit device;

the encoder for internally encoding configuration data obtained from the configuration memory via the internal configuration access port;

the internal configuration access port being internal to the integrated circuit device and configurable for internally reading back the configuration data written to the configuration memory without having to export the configuration data read from the configuration memory of the integrated circuit device as part of the reading back;

output of the configuration memory for directly controlling states of programmable gates of the integrated circuit device; and the peripheral interface for sending the configuration data encoded external to the integrated circuit device.

22. A system for decoding configuration data, comprising:

an integrated circuit device having an internal configuration access port, configuration memory, a configuration interface and configuration resources;

boot memory coupled to the configuration interface of the integrated circuit device;

the boot memory containing boot cores for writing to the configuration memory via the configuration interface and the configuration resources to configure the integrated circuit device;

the boot cores including an encoder core;

the encoder core for providing a peripheral interface internal to the integrated circuit device;

at least one set of instructions accessible by a processing device internal to the integrated circuit device, the at least one set of instructions for internally encoding configuration data obtained from the configuration memory via the internal configuration access port;

the internal configuration access port being internal to the integrated circuit device and configurable for internally reading back the configuration data written to the configuration memory without having to export the configuration data read from the configuration memory of the integrated circuit device as part of the reading back;

output of the configuration memory for directly controlling states of programmable gates of the integrated circuit device; and the peripheral interface for sending the configuration data encoded external to the integrated circuit device.

\* \* \* \* \*